(12) United States Patent
Walker et al.

(10) Patent No.: US 9,606,590 B2
(45) Date of Patent: Mar. 28, 2017

(54) HEAT SINK BASE AND SHIELD

(75) Inventors: Paul N. Walker, Cypress, TX (US); Earl W Moore, Cypress, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 146 days.

(21) Appl. No.: 14/357,360

(22) PCT Filed: Dec. 22, 2011

(86) PCT No.: PCT/US2011/066755
§ 371 (c)(1),
(2), (4) Date: May 9, 2014

(87) PCT Pub. No.: WO2013/095490
PCT Pub. Date: Jun. 27, 2013

(65) Prior Publication Data
US 2014/0307385 A1  Oct. 16, 2014

(51) Int. Cl.
*H05K 7/20* (2006.01)
*G06F 1/20* (2006.01)
*H01L 23/36* (2006.01)
*H01L 23/40* (2006.01)
*H05K 3/30* (2006.01)
*H01L 23/473* (2006.01)

(52) U.S. Cl.
CPC ............... *G06F 1/20* (2013.01); *H01L 23/36* (2013.01); *H01L 23/4006* (2013.01); *H05K 3/303* (2013.01); *H01L 2924/0002* (2013.01); *Y10T 29/49117* (2015.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/46–23/467

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 5,969,940 A | * | 10/1999 | Sano | G06F 1/1616 361/679.52 |
| 6,324,072 B1 | * | 11/2001 | Lorenz | H01L 25/072 257/723 |
| 6,711,021 B1 | * | 3/2004 | Morris | H05K 1/141 165/104.33 |
| 7,738,252 B2 | | 6/2010 | Schuette et al. | |

(Continued)

FOREIGN PATENT DOCUMENTS

JP   2006-339325 A   12/2006
KR   10-2010-0016718 A   2/2010

OTHER PUBLICATIONS

International Search Report and Written Opinion, International Application No. PCT/US2011/066755, Date of Mailing: Aug. 29, 2012, pp. 1-8.

*Primary Examiner* — Anthony Haughton
*Assistant Examiner* — Razmeen Gafur
(74) *Attorney, Agent, or Firm* — HPI Patent Department

(57) ABSTRACT

A heat sink of a computing system includes a base and a shield associated with a component. The base is to mount to the computing system, and the shield is to be coupled to the base.

17 Claims, 6 Drawing Sheets

(56) References Cited

U.S. PATENT DOCUMENTS

| | | | |
|---|---|---|---|
| 7,768,785 B2 | 8/2010 | Ni et al. | |
| 7,929,307 B2 | 4/2011 | Hsieh | |
| 2002/0008963 A1* | 1/2002 | DiBene, II | G06F 1/18 361/720 |
| 2003/0123228 A1* | 7/2003 | Bhatia | H01L 23/3675 361/705 |
| 2004/0212964 A1* | 10/2004 | Belady | H01L 23/36 361/704 |
| 2006/0126295 A1* | 6/2006 | Tilton | H01L 23/4735 361/699 |
| 2007/0086170 A1* | 4/2007 | Liang | H01L 23/367 361/719 |
| 2007/0091567 A1* | 4/2007 | Hayashi | G06F 1/20 361/695 |
| 2007/0097653 A1* | 5/2007 | Gilliland | H01L 23/552 361/719 |
| 2007/0165376 A1* | 7/2007 | Bones | H01L 25/162 361/688 |
| 2007/0206353 A1* | 9/2007 | Boone | H05K 7/20727 361/694 |
| 2007/0211436 A1* | 9/2007 | Robinson | H01L 23/552 361/719 |
| 2008/0101035 A1 | 5/2008 | Chen | |
| 2008/0151487 A1* | 6/2008 | Ni | H01L 23/367 361/679.31 |
| 2008/0151501 A1* | 6/2008 | Takasou | H05K 7/20154 361/697 |
| 2008/0266807 A1* | 10/2008 | Lakin | H05K 7/20409 361/709 |
| 2008/0285238 A1 | 11/2008 | Gilliland et al. | |
| 2008/0289797 A1* | 11/2008 | Shen | H01L 23/34 165/80.2 |
| 2009/0016025 A1* | 1/2009 | Johnson | H01L 23/3733 361/704 |
| 2009/0091888 A1* | 4/2009 | Lin | H01L 23/367 361/704 |
| 2009/0268408 A1 | 10/2009 | Liu et al. | |
| 2010/0142153 A1* | 6/2010 | Ho | H01L 23/3677 361/710 |
| 2010/0208422 A1* | 8/2010 | Tai | G06F 1/20 361/679.31 |
| 2010/0246137 A1* | 9/2010 | Magana | H04B 1/036 361/713 |
| 2010/0315787 A1 | 12/2010 | Li et al. | |
| 2011/0002103 A1 | 1/2011 | Lee | |
| 2011/0194259 A1* | 8/2011 | Goriaux | H05K 1/0204 361/720 |
| 2011/0205710 A1* | 8/2011 | Kondo | H05K 9/006 361/714 |
| 2011/0255247 A1* | 10/2011 | Chu | H01L 23/4093 361/709 |
| 2011/0273845 A1* | 11/2011 | Jones | B25B 7/00 361/699 |
| 2011/0299248 A1* | 12/2011 | Liu | H05K 7/20436 361/695 |
| 2012/0050998 A1* | 3/2012 | Klum | G06F 21/86 361/720 |
| 2012/0300403 A1* | 11/2012 | Scholeno | H01R 13/6595 361/702 |
| 2012/0300405 A1* | 11/2012 | Weeber | H01L 23/552 361/709 |

\* cited by examiner

HEAT SINK BASE AND SHIELD

CROSS-REFERENCE TO RELATED APPLICATION

This application is a national stage application under 35 U.S.C. §371 of PCT/US2011/066755, filed Dec. 22, 2011.

BACKGROUND

A computing system may include a component that generates heat. Heat may be localized in a hot spot on a surface of the computing system. The hot spot may cause user concern, discomfort, or even injury. High-powered components and thin computing system form-factors may exacerbate hot spots.

BRIEF DESCRIPTION OF THE DRAWINGS/FIGURES

DETAILED DESCRIPTION

A heat sink of a computing system is to dissipate and spread out heat from a component to prevent a hot spot (a localized heat differential) on a surface of a computing system corresponding to a location of the component. The heat sink may comply with standard component form factors and thin computing system form factors. The heat sink may be customized to a particular computing system design, to provide enhanced benefits that would otherwise not be available.

The heat sink may include a base and a shield. The base may be mounted to the computing system (e.g., to a substrate and/or printed circuit board (PCB) such as a motherboard) to receive the component. The base may mount the component and/or thermally couple a first face of the component to the base. The shield may be mounted to the base to thermally couple a second face of the component to the shield. The shield may be thermally coupled to the base. The shield and/or base may include a heat spreader and may be composed of a combination of materials. Thus, the base and/or shield may dissipate heat from the component and prevent hot spots on exposed surfaces of the computing system (e.g., on surfaces of the computing system including its housing, body, panels, chassis, and the like).

Figure 1:
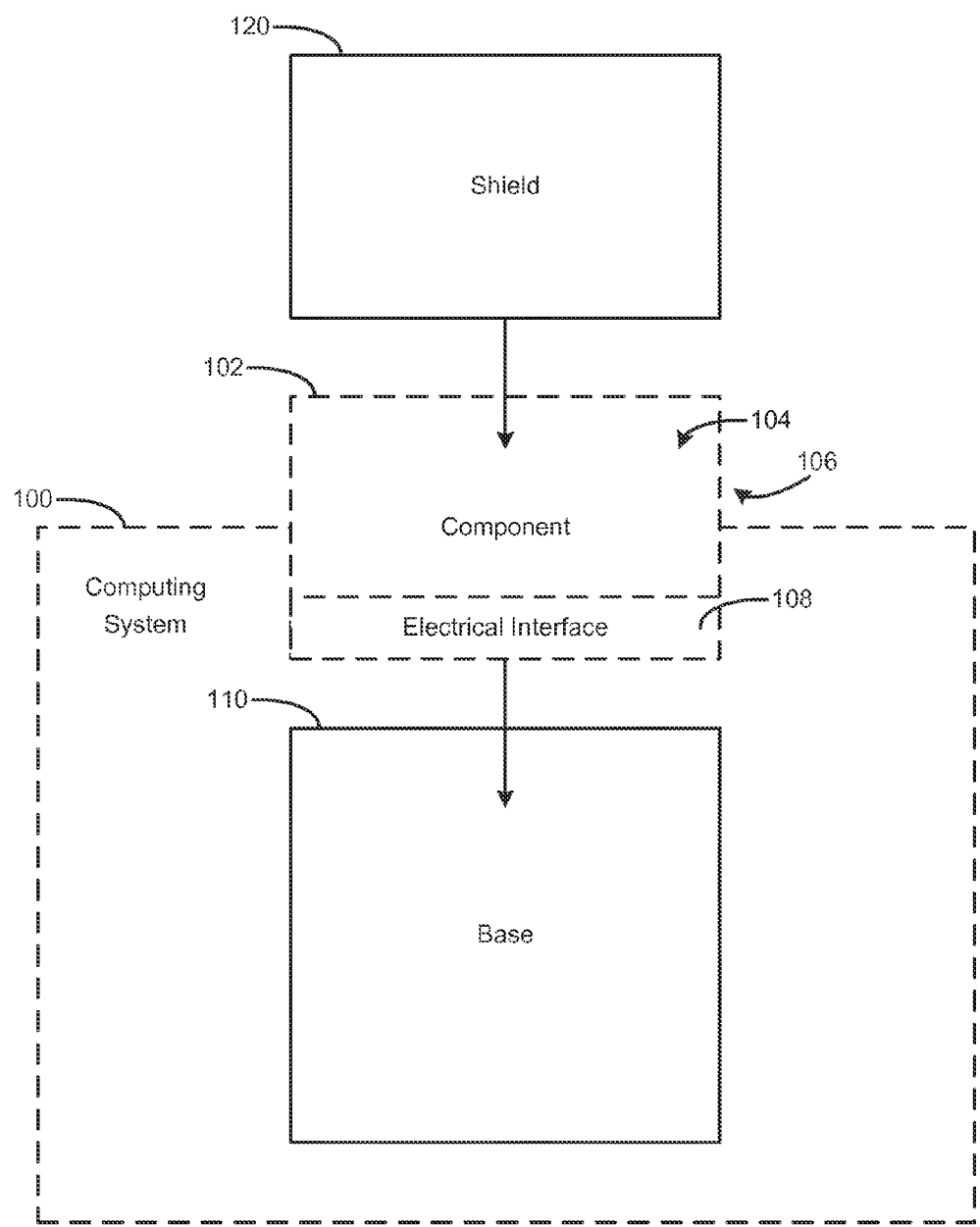
FIG. 1 is a block diagram of a heat sink including a base and shield according to an example.

FIG. 1 is a block diagram of a heat sink including a base 110 and shield 120 according to an example. The base 110 may be mounted to a computing system 100, and may include a gap and/or passage to allow air to pass between the base 110 and the computing system 100. A component 102 (e.g., a memory module) may be coupled to the base 110. The base 110 may include at least one fastener (e.g., a latch for mounting the component), and the component 102 may be coupled to the base 110 by using the shield 120 to sandwich the component 102 between the base 110 and the shield 120. The base 110 and/or the shield 120 may enable an electrical interface 108 of the component 102 to be coupled to the computing system 100.

The component 102 may be a memory module (such as a dual in-line memory module (DIMM) or small outline dual in-line memory module (SODIMM)), network module, central processing unit (CPU), graphics processing unit (GPU), wireless interface module (e.g., wireless local area network (WLAN), Bluetooth, etc.), sound processor, input/output (I/O) processor, northbridge (NB) controller, southbridge (SB) controller, memory controller, storage and/or storage controller (e.g., hard disk drive, solid state disk (SSD) drive, etc.), and other controllers, chipsets, and/or other components associated with a computing system.

The shield 120 may be coupled to the base 110, to sandwich the component 102 between the shield 120 and the base 110. The shield 120 may be biased against the component 102 and/or the base 110, to enhance heat transfer from first face 104 and second face 106 of the component 102. The shield 120 may be thermally coupled to the base 110 to enable heat to transfer between the shield 120 and the base 110. The shield 120 and base 110 are shown as rectangles, but may have any shape and/or size for spreading heat. In an example, shield 120 is wider and taller than the component 102, to spread any concentrated/localized areas of heat from the component 102 across the shield 120.

The shield 120 may be dimensioned to correspond to dimensions of the component 102. In an example, the shield 120 may surround and enclose the component 102. The shield 120 may extend across the first face 104 to edges of the component 102, and may wrap around the edges of the first face 104 to enclose sides of the component 102. Thus, the shield 120 may enclose component 102, or otherwise protect a user from heat by preventing hot spots. The shield 120 also may enclose the component 102 to prevent transmission of electromagnetic interference (EMI) to and/or from the component 102. The shield 120 may have a low profile, to spread heat from the component 102 without substantially increasing a thickness of the component 102. Thus, shield 120 may contribute to enabling a slim profile for computing system 100. The shield 120 may be dimensioned to correspond to the base 110, for coupling the shield 120 to the base 110.

The shield 120 also may be dimensioned differently than the component 102, and may extend along a plane parallel to the first face 104 of the component 102 to cover less than or more than the entirety of first face 104. In an example, the shield 120 may be larger than the component 102 to overlap the component 102 and extend beyond at least one edge of the component 102. Thus, the shield 120 may spread heat from the component 102 to a surface area corresponding to the shield 120 that is larger than a surface area of the component 102. Although shown as a rectangle with straight edges, the shield 120 may be formed in additional shapes and include additional features such as an oval shape having feathered edges. The shield 120 also may be thermally coupled to the base 110, to spread heat to/from the shield 120 and the base 110.

The base 110 may be dimensioned to correspond to the shield 120, for coupling the base 110 to the shield 120. The base 110 also may be dimensioned to correspond to component 102, and may be dimensioned based on standard form-factors for component 102 and/or computing system 100. The base 110 and/or shield 120 may be formed of heat conducting material such as aluminum, copper, metals, alloys, and/or other heat dissipating materials. The base 110 and/or shield 120 also may be made of different materials, and a portion of the base 110 and/or shield 120 may be made of a non-metallic and/or a non-heat-conducting material. For example, the shield 120 may include a plastic portion and a metal portion, such as a plastic frame with a metal heat spreader. Base 110 may transfer heat to and/or from shield 120, further removing the potential for hot-spots associated with component 102. Base 110 may include at least one integrated fastener.

The base 110 may be spaced from the computing system 100. For example, the base 110 may include an air passage to allow air to pass between the base 110 and the computing system 100. In another example, the base 110 may be coupled to a PCB of the computing system 100 using a spacer, standoff, or other technique to space the base 110 from the PCB. Thus, the base 110 may also dissipate heat, based on convection, away from the component 102, to air between the base and the PCB of the computing system 100. The spacing between the base 110 and the PCB of the computing system 100 may provide electrical insulation. For example, a metallic base 110 may be spaced from the PCB using insulating (e.g., plastic) spacers to prevent the base 110 from electrically affecting the PCB. The shield 120 and/or base 110 may be usable on differently shaped components 102 to be installed in the computing system 100. Thus, shield 120 and/or base 110 may provide enhanced heat spreading/transfer for multiple different components, and may be re-usable when a component 102 is replaced or upgraded. Shield 120 and base 110 are not limited to specific dimensions of standard form factors for compartments of a computing system (e.g., a memory module compartment built into a chassis of a computing system). Thus, shield 120 and base 110 may form a part of computing system 100, and may provide benefits specific to that computing system 100 by extending beyond standard dimensions without being limited to particular generic/standard sizes and/or thicknesses. For example, shield 120 and base 110 may extend beyond a standard form-factor footprint of component 102, larger than a standard form-factor compartment for component 102. Shield 120 and base 110 thus may provide heat removal and heat spreading exceeding that of a heatsink limited to the dimensions of the component 102.

The shield 120, base 110, fasteners, and/or other components may comply with computing memory standards, including standard memory module mounting configurations to secure component 102 to base 110. The shield 120, base 110, and/or other components may be implemented in various ways to fit form factor configurations of a computing system 100, enabling design flexibility including thin notebooks (ultrabooks), tablet computing systems, netbooks, and other slim form-factor computing systems 100 that may include a confined memory area and/or compartment without extra room for large memory heatsinks. Thus, the base 110 and shield 120 may enable a surface of the computing system 100 (e.g., a body panel, chassis, or other portion of the computing system 100) to be within close proximity to the component 102 or other heat-generating portion of the computing system 100, without causing a hot spot on that surface. For example, a surface of the computing system 100 may be positioned in contact with the shield 120. At such a close proximity, a heat-generating component 102 may otherwise cause a hot spot on the surface of the computing system 100, in the absence of the base 110 and/or shield 120 to prevent the hot spot. Accordingly, the base 110 and shield 120 may enhance computing systems 100 based on ultra-thin, tablet, or other form factors where a surface of the computing system 100 is likely to be in close proximity to (e.g., within a range to otherwise be affected by heating/hot spots, including being in contact with) heat-generating components.

The component 102 may be biased against the base 110 and/or the shield 120 to enhance heat transfer between the component 102, shield 120, and/or the base 110. In an example, the base may include fasteners including a spring clip, and/or the fasteners may be configured, positioned, and/or oriented to bias the component 102. Thus, the heat generated by even a high-powered component 102 may be dissipated and moved away from localized hot-spots that may otherwise be generated by the component 102.

The base 110 may include a unified heat-conducting structure, that may include fastener(s) and/or shield 120. Thus, heat may be readily transferred between the component 102, base 110, fasteners, and/or shield 120. The shield 120 and base 110 may be thermally coupled to each other such that heat may be transferred between the shield 120 and base 110. The shield 120 and/or base 110 may include at least one heat spreader. A heat spreader may extend to points of contact (e.g., mounting points and/or fasteners) of the shield 120 and the base 110 to facilitate heat transfer. Thus, shield 120 may pull heat away from the component 102, spread out the heat to eliminate hot spots, and move the heat away from the component 102. The base 110 may provide similar heat transferring benefits, and heat may pass between the shield 120 and base 110.

The shield 120 and/or base 110 thus may be installed as re-usable components of the computing system 100, enabling enhanced performance tailored to any specific design of computing system 100, while also capable of being used on various components of computing system 100. The shield 120 may interlock and/or be coupled with the component 102 and/or the base 110 to secure the shield 120 on top of the component 102 and/or base 110. Thus, shield 120 and base 110 may cooperate to secure component 102, without the use of dedicated fasteners for securing the component 102 to the base.

Figure 2:
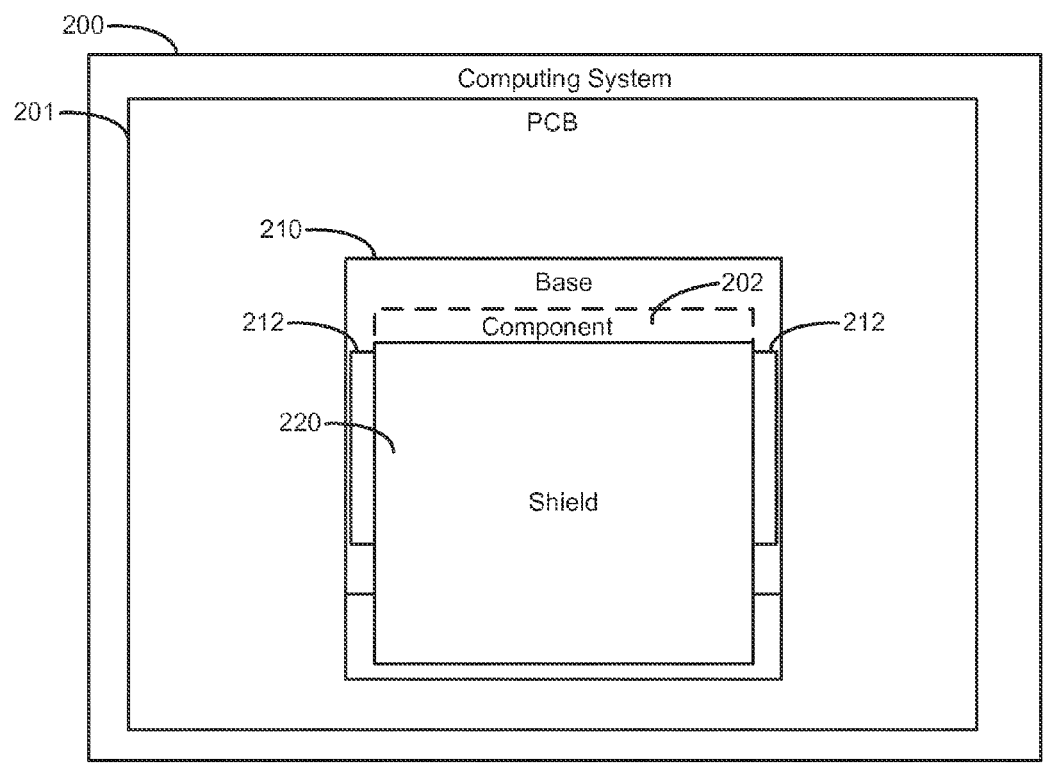
FIG. 2 is a block diagram of a heat sink including a base and shield according to an example.

FIG. 2 is a block diagram of a heat sink including a base 210 and shield 220 according to an example. The base 210 and shield 220 are shown assembled on computing system 200. The base 210 is mounted to PCB 201 of computing system 200. The example of FIG. 2 also illustrates fasteners 212 to mount component 202 to the computing system 200.

The fastener(s) 212 may be dimensioned based on standard form-factors for mounting component 202 to computing system 100. Fasteners 212 may releasably secure component 202 to the base 210. For example, component 202 (e.g., a memory module) may be inserted at an angle to the base (e.g., approximately 35-40 degrees), and rotated into position to be secured by fasteners 212 (e.g., latches to latch a memory module into place against the base 210). Fasteners 212 may include spring cops that snap into place to secure component 202. Other fasteners 212 may be used, including screw mounts, glue, and the like.

In the example of FIG. 2, the shield 220 may be thermally coupled to the fasteners 212, which may be thermally coupled to the base 210. Thus, heat generated by component 202 may be spread across shield 220, fasteners 212, and base 210. Shield 220 and/or base 210 may cover a portion of component 202, and may enable a portion of component 202 to be exposed (e.g., for allowing aft to flow around component 202 while spreading heat and preventing localized hot spots). The shield 220 may be secured against the component 202 by mounting directly to the base 210 (e.g., via screw mounting points, hooks, or other fasteners). The shield 220 also may be secured against the component 202 by mounting to the fasteners 212, and/or by mounting to the shield 220 to the component 202.

Figure 3:
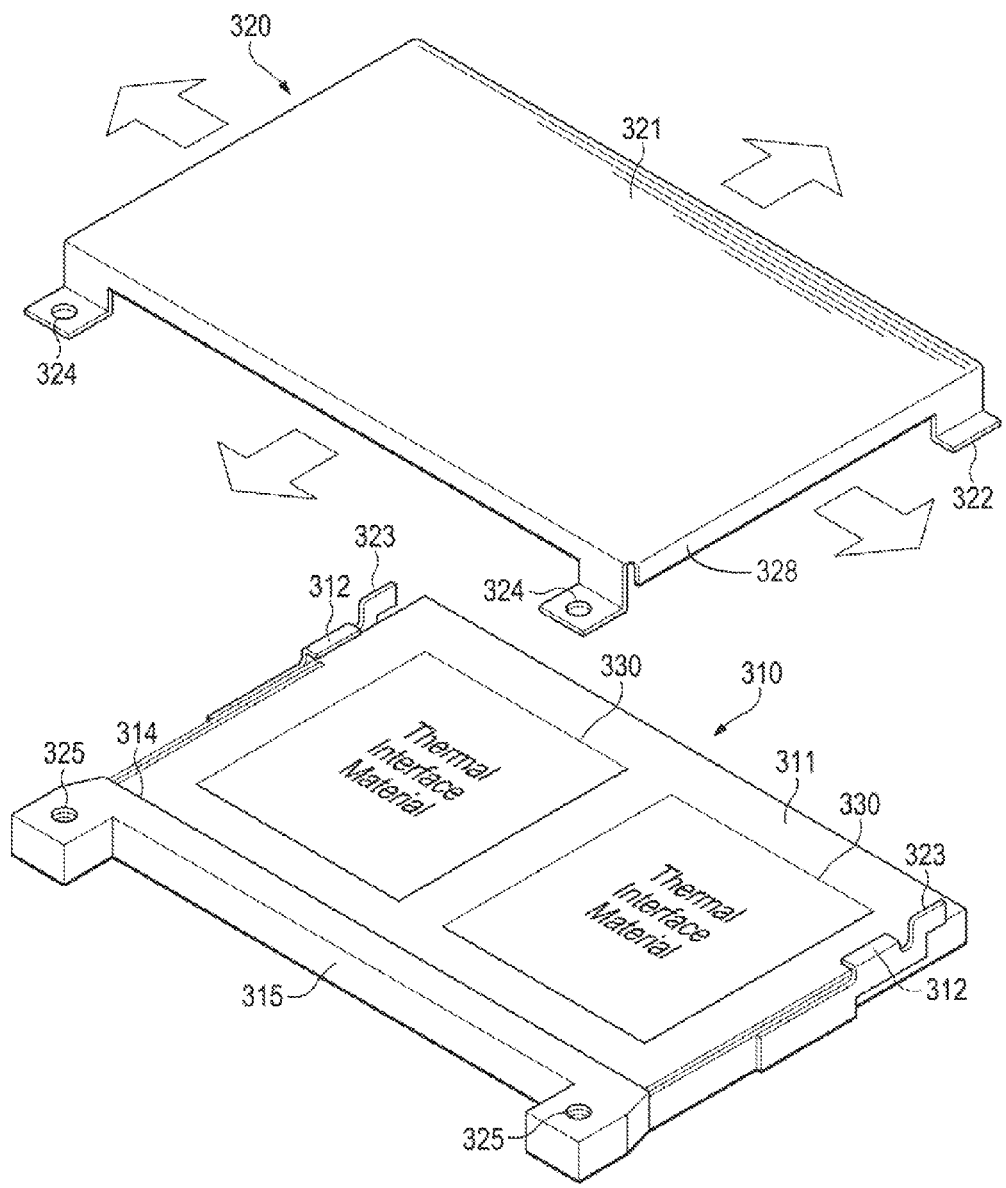
FIG. 3 is a perspective view of a heat sink including a base and shield according to an example.

FIG. 3 is a perspective view of a heat sink including a base 310 and shield 320 according to an example. Although the example in FIG. 3 illustrates base 310 and shield 320 to be used with a memory module, the base 310 and shield 320 may be used and/or customized for other components of a computing system. The shield 320 may include a shield heat spreader 321, shield hooks 322, and shield screw points 324. The base 310 may include base heat spreader 311, fasteners 312 (illustrated as latches), slot 314, base hooks 323, and base screw points 325.

Although the shield 320 is shown as a rectangle approximately corresponding to the dimensions of the base 310, dimensions of the shield 320 and/or the base 310 may be extended laterally as indicated by the arrows. The shape of the shield 320 (and/or the base 310) is shown generally as a rectangle, but may be any shape and is not limited to a rectangular shape. The shield 320 also may include at least one lip 328 extending downward from the edges of the shield 320.

The base 310 (and/or the shield 320) may include a thermal interface material (TIM) 330 to enhance thermal coupling, e.g., with base heat spreader 311. TIM 330 is shown as two rectangles, but may assume any shape and/or size and may be shaped/sized based on a component to be installed at the base 310. The fasteners 312 may be formed from the material of the base 310 such that the base 310 and fasteners 312 are a unified structure. The fasteners 312 also may be formed separately of a resilient material such as spring steel or the like that is integrated with the base 310. The base hooks 323 may be formed separate from the fasteners 312, and may be integral with the fasteners 312 as shown in the example FIG. 3. The base 310 may include a slot 314 to allow insertion of an electrical interface of a component through the base 310 to the underlying computing system. However, the base 310 may be dimensioned to not extend beyond slot 314, wherein slot 314 (and/or screw points 325 and corresponding lower extension 315) may be omitted while enabling coupling between the component and computing system.

The shield 320 may be thermally coupled to the base 310 using shield hooks 322, shield screw points 324, and other portions of the shield 320 and/or base 310 such as lip(s) 328 and undersides of the shield 320. Shield hooks 322 may be hooked to base hooks 323, and shield screw points 324 may be fastened to base screw points 325 using screws or other fasteners. The shield hooks 322 and/or base hooks 323 may interact with each other to snap into place when the shield 320 is pressed on top of the base 310. The fasteners 312 may operate independently of base hooks 323. The fasteners 312 may retain a component against the base 310, while shield 320 is released by flexing base hooks 323 away from base 310 to release shield hooks 322. Shield hooks 322 are shown extending outward, and examples may include inward-extending shield hooks 322 (e.g., to fasten shield 320 onto a component, to fasten onto hooks 312, to guide installation of a component, and/or to fasten shield 320 directly to base 310).

Figure 4:
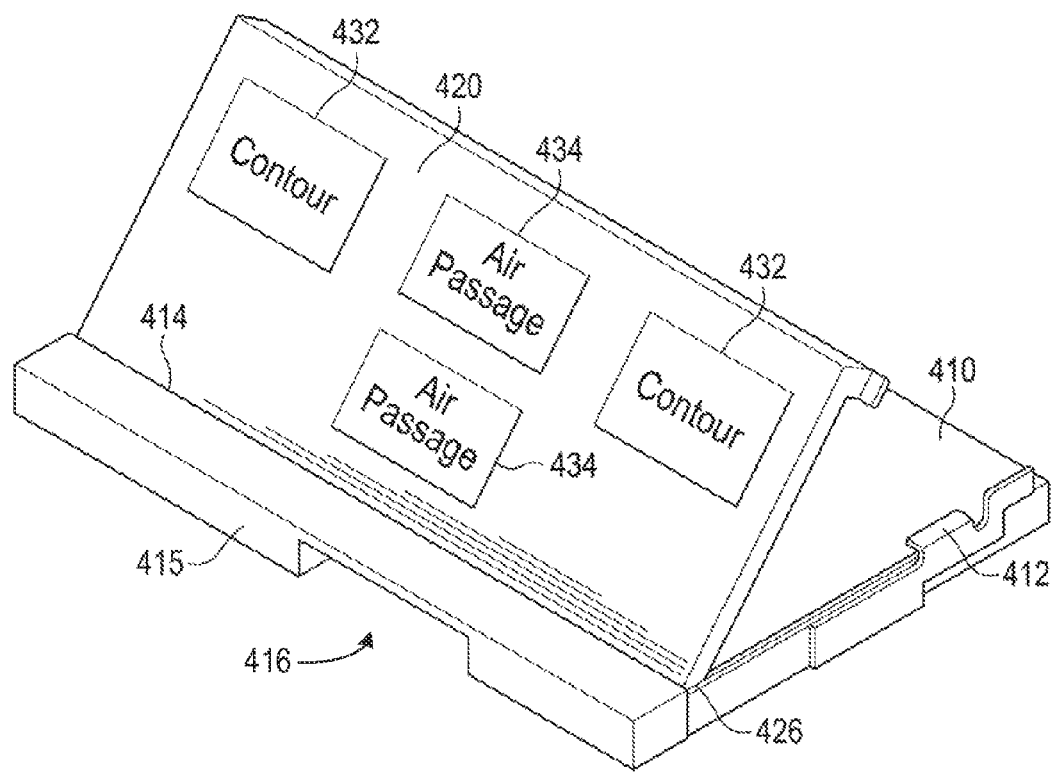
FIG. 4 is a perspective view of a heat sink including a base and shield according to an example.

FIG. 4 is a perspective view of a heat sink including a base 410 and shield 420 according to an example. Although the example in FIG. 4 illustrates base 410 and shield 420 to be used with a memory module, the base 410 and shield 420 may be customized for other components of a computing system. The shield 420 is pivotably mounted to the base 410 at pivot 426. Thus, the shield 420 may be pivoted between an open position (as shown) and a closed position wherein the shield 420 and the base 410 are thermally coupled to an installed component. Base 410 may include a lower extension 415 and associated slot 414 through which a component may be electrically coupled to the computing system, although slot 414 and lower extension 415 may be omitted. Base 410 also may include a gap 416, e.g., a gap and/or spacing to allow air or other fluid to pass between the base 410 and the PCB of the computing system. Although shown as extending across a portion of the base 410, the gap 416 may extend across more and/or less of the base 410. In an example, the gap 416 may extend across the entirety of the base 410, e.g., the base 410 may be spaced from the computing system. Thus, air may pass underneath base 410 (e.g., between base 410 and the PCB of the computing system) to provide cooling to the base 410 and insulation of the base 410 from the PCB.

The shield 420 and/or base 410 may include contour(s) 432 and air passage(s) 434. The contours 432 may provide a close fit or other accommodations between the shield 420 and a component, and may provide channels for air flow along the shield 420 or other benefits. Air passages 434 may allow air to flow through the shield 420. The shield 420 and/or pivot 426 may include a bias such as a spring to bias the shield 420 in an open position for easy installation of a component.

A component may be inserted between the base 410 and the shield 420 at an angle to the base 410 to electrically couple the component to the computing system. The component may then be pivoted down to allow the fasteners 412 to fasten (e.g., snap onto) the component and thermally couple the component to the base 410. The shield 420 may then be pivoted to snap into place against the component. The shield 420 may be used to pivot the component such that the shield and component pivot together and snap into fasteners 412 (including hooks or other fasteners for shield 420 and/or the component). The shield 420 may include a guide to assist in proper positioning and/or pivoting of the component for installation.

Figure 5:
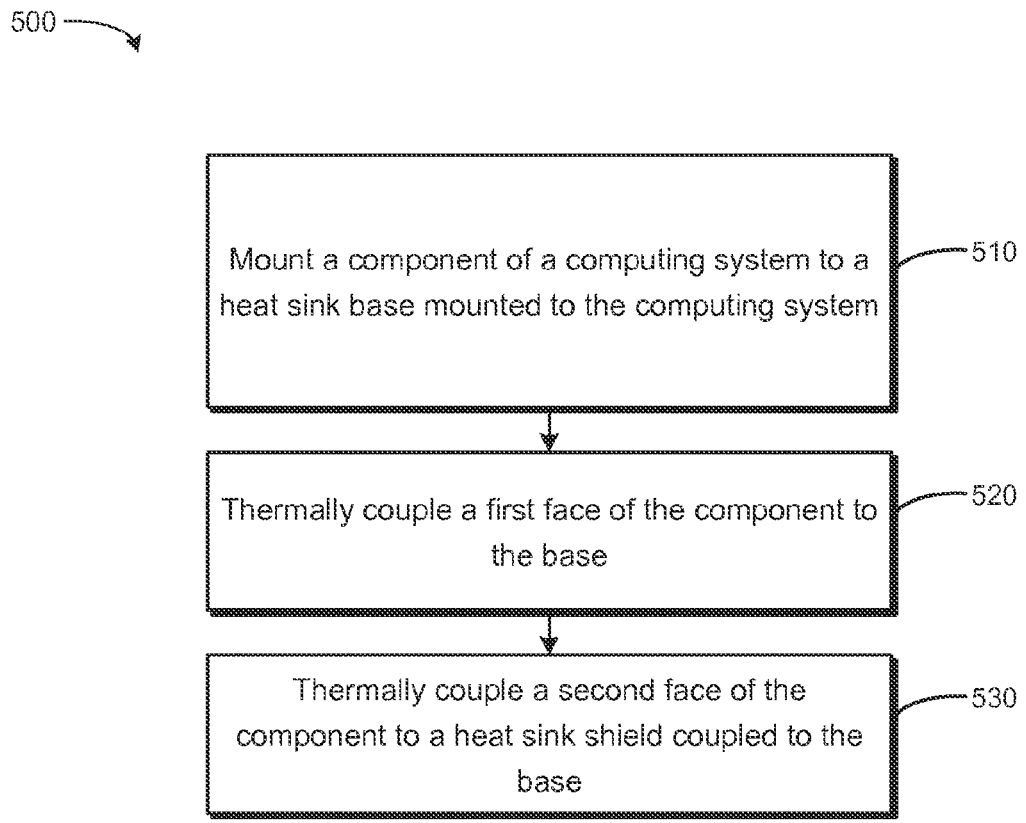
FIG. 5 is a flow chart based on a heat sink according to an example.

FIG. 5 is a flow chart 500 based on a heat sink according to an example. In block 510, a component of a computing system is mounted to a heat sink base mounted to the computing system. For example, the base may include fasteners to mount the component, and the base may be formed as a unified structure with the fasteners to enhance heat transfer and facilitate assembly of a computing system using the example base. The base may be spaced from the computing system. In block 520, a first face of the component is thermally coupled to the base. For example, the base may include a base heat spreader, may include a bias to force the component against the base, and may include a thermal interface material (TIM). In block 530, a second face of the component is thermally coupled to a heat sink shield coupled to the base. In an example, the shield may include a shield heat spreader, a bias to force the shield against the component, and a TIM. The shield and base may be thermally coupled to each other.

Figure 6:
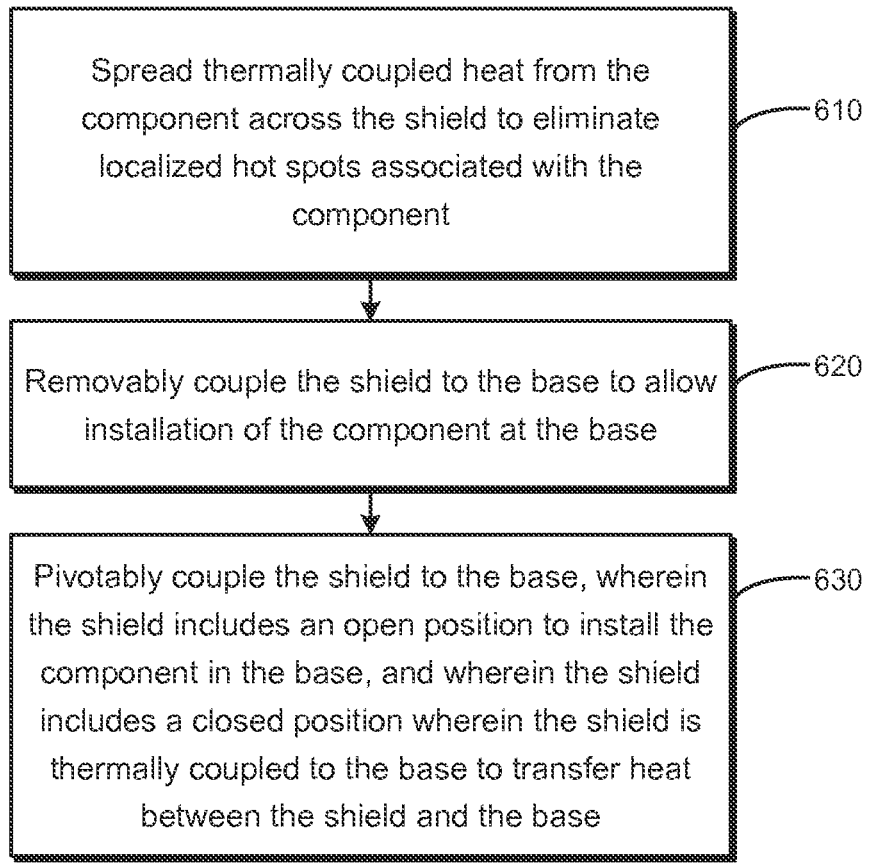
FIG. 6 is a flow chart based on a heat sink according to an example.

FIG. 6 is a flow chart 600 based on a heat sink according to an example. The heat sink may be used with a component to prevent hot spots. In block 610, thermally coupled heat is spread from the component across the shield to eliminate localized hot spots associated with the component. In an example, the shield may include a heat spreader and may be formed of multiple different materials. In block 620, the shield is removably coupled to the base to allow installation of the component at the base. In an example, the shield may be fastened to the base using screw mounts, hooks, latches, or other fasteners such that the shield may exchange heat with the base. In block 630, the shield may be pivotably coupled to the base, wherein the shield includes an open position to install the component in the base, and wherein the shield includes a closed position wherein the shield is thermally coupled to the base to transfer heat between the shield and the base. In an example, the shield may attach to the base via a pivot such as a hinge, or may use hooks to pivot about the base. An edge of the shield may include a non-pivoting fastener such as screw mounts, latches, or the like to secure the shield in the closed position sandwiching the component between the shield and the base.

What is claimed is:

1. A heat sink comprising:
    a metal base to be mounted to a circuit board of a computing system and to receive a component, wherein the metal base is to thermally contact a first face of the component; and
    a metal shield pivotally attached to the metal base, the metal shield to thermally contact a second face of the component, the second face opposite of the first face on the component, wherein the metal shield is pivotable between an open position with respect to the metal base and a closed position with respect to the metal base,
    wherein when the metal shield is pivoted to the open position, the component is insertable into a space between the metal base and the metal shield, and
    wherein the metal shield is pivotable from the open position to the closed position after insertion of the component to sandwich the component between the metal shield and the metal base.

2. The heat sink of claim 1, wherein the metal base and the metal shield are formed of heat conductive materials to spread heat generated by the component.

3. The heat sink of claim 1, wherein at least one of the metal base and the metal shield is contoured based on the component.

4. The heat sink of claim 1, further comprising a thermal interface material on the metal base, the metal base to thermally contact the first face of the component through the thermal interface material.

5. The heat sink of claim 1, wherein the component is a memory module, and the metal base includes a fastener to releasably mount the memory module to the metal base.

6. A heat sink comprising:
    a base to be mounted to a computing system and to receive a component, wherein the base is to thermally couple a first face of the component; and
    a shield to thermally couple a second face of the component, wherein the shield is pivotably attached to the base, the shield pivotable between an open position with respect to the base and a closed position with respect to the base,
    wherein when the shield is pivoted to the open position, the component is insertable into a space between the base and the shield, and
    wherein the shield is pivotable from the open position to the closed position after insertion of the component to sandwich the component between the shield and the base.

7. The heat sink of claim 6, wherein when the shield is pivoted to the open position, the component is insertable at an angle into the space between the base and the shield.

8. The heat sink of claim 6, wherein the base is a metal base.

9. The heat sink of claim 6, wherein the base has an air gap to provide a space for airflow between the base and a circuit board to which the base is to be mounted.

10. The heat sink of claim 6, wherein the shield has an opening to allow airflow through the shield.

11. A computing system comprising:
    a printed circuit board (PCB);
    a component;
    a base securing the component to the PCB, wherein the base is to transfer heat from a first face of the component; and
    a shield pivotably attached to the base, wherein the shield is to transfer heat from a second face of the component, wherein the shield is pivotable between an open position with respect to the base and a closed position with respect to the base,
    wherein the component is insertable into a space between the base and the shield when the shield is pivoted to the open position, and
    wherein the shield is pivotable from the open position to the closed position after insertion of the component to sandwich the component between the shield and the base.

12. The computing system of claim 11, further comprising a body surface in close proximity to the component, wherein the shield is to prevent a hot spot on the body surface due to heat from the component.

13. The computing system of claim 11, wherein the base includes a slot to admit an electrical interface of the component to interface with the computing system.

14. The computing system of claim 11, further comprising an air passage between the base and the PCB.

15. The computing system of claim 11, wherein the base is thermally contacted to the first face of the component, and the shield is thermally contacted to the second face of the component, the second face being opposite of the first face on the component.

16. The computing system of claim 11, wherein the base is a metal base, and the shield is a metal shield.

17. The computing system of claim 11, wherein the shield has an opening to allow airflow through the shield.

* * * * *